(12) United States Patent
Wang

(10) Patent No.: US 8,864,090 B2
(45) Date of Patent: Oct. 21, 2014

(54) FIXING APPARATUS FOR WAVEGUIDE PLATE

(75) Inventor: Jun-Wei Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 179 days.

(21) Appl. No.: 13/403,924

(22) Filed: Feb. 23, 2012

(65) Prior Publication Data

US 2013/0105654 A1    May 2, 2013

(51) Int. Cl.
*H01L 23/48* (2006.01)
*H05K 9/00* (2006.01)

(52) U.S. Cl.
CPC ................... *H05K 9/0041* (2013.01)
USPC .......... 248/309.1; 248/27.3; 439/64; 439/330; 361/818; 257/688; 257/E23.086

(58) Field of Classification Search
CPC .......... H05K 9/0041; H05K 9/00; H05K 7/20
USPC ............ 248/309.1, 27.1, 27.3; 439/607.1, 64, 439/329, 330; 361/818; 257/688, E23.086
See application file for complete search history.

(56) References Cited

U.S. PATENT DOCUMENTS

| | | | |
|---|---|---|---|
| 3,638,033 A * | 1/1972 | Johnson et al. | 313/505 |
| 4,571,015 A * | 2/1986 | Mueller | 439/64 |
| 5,747,735 A * | 5/1998 | Chang et al. | 174/51 |
| 7,511,368 B2 * | 3/2009 | Jordan | 257/688 |
| 2006/0121784 A1 * | 6/2006 | Lee | 439/607 |
| 2008/0251893 A1 * | 10/2008 | English | 257/659 |
| 2011/0188226 A1 * | 8/2011 | Kim | 361/818 |

* cited by examiner

*Primary Examiner* — Anita M King
(74) *Attorney, Agent, or Firm* — Novak Druce Connolly Bove + Quigg LLP

(57) ABSTRACT

A fixing apparatus for fixing a waveguide plate includes a number of conductive fixing members fixed to corresponding sides of the waveguide plate, and a bracket. Each fixing member includes a fixing portion having an identical length to the corresponding sidewall and a resilient abutting portion extending from a side of the fixing portion. Each fixing portion is in tight contact with the corresponding side of the waveguide plate. The waveguide plate is received in the bracket. The resilient abutting portions resiliently abut against an inner surface of the bracket.

6 Claims, 3 Drawing Sheets

FIXING APPARATUS FOR WAVEGUIDE PLATE

BACKGROUND

1. Technical Field

The present disclosure relates to an apparatus for fixing a waveguide plate.

2. Description of Related Art

The chassis of an electrical device generally defines a plurality of holes for dissipating heat, which easily leads to a leakage problem of electromagnetic waves. To solve the problem, a waveguide plate is fixed to the chassis. However, the waveguide plate is generally fixed to the chassis with screws, leaving a clearance between the waveguide plate and the chassis. Electromagnetic waves generated by the electrical device can escape through the clearance.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
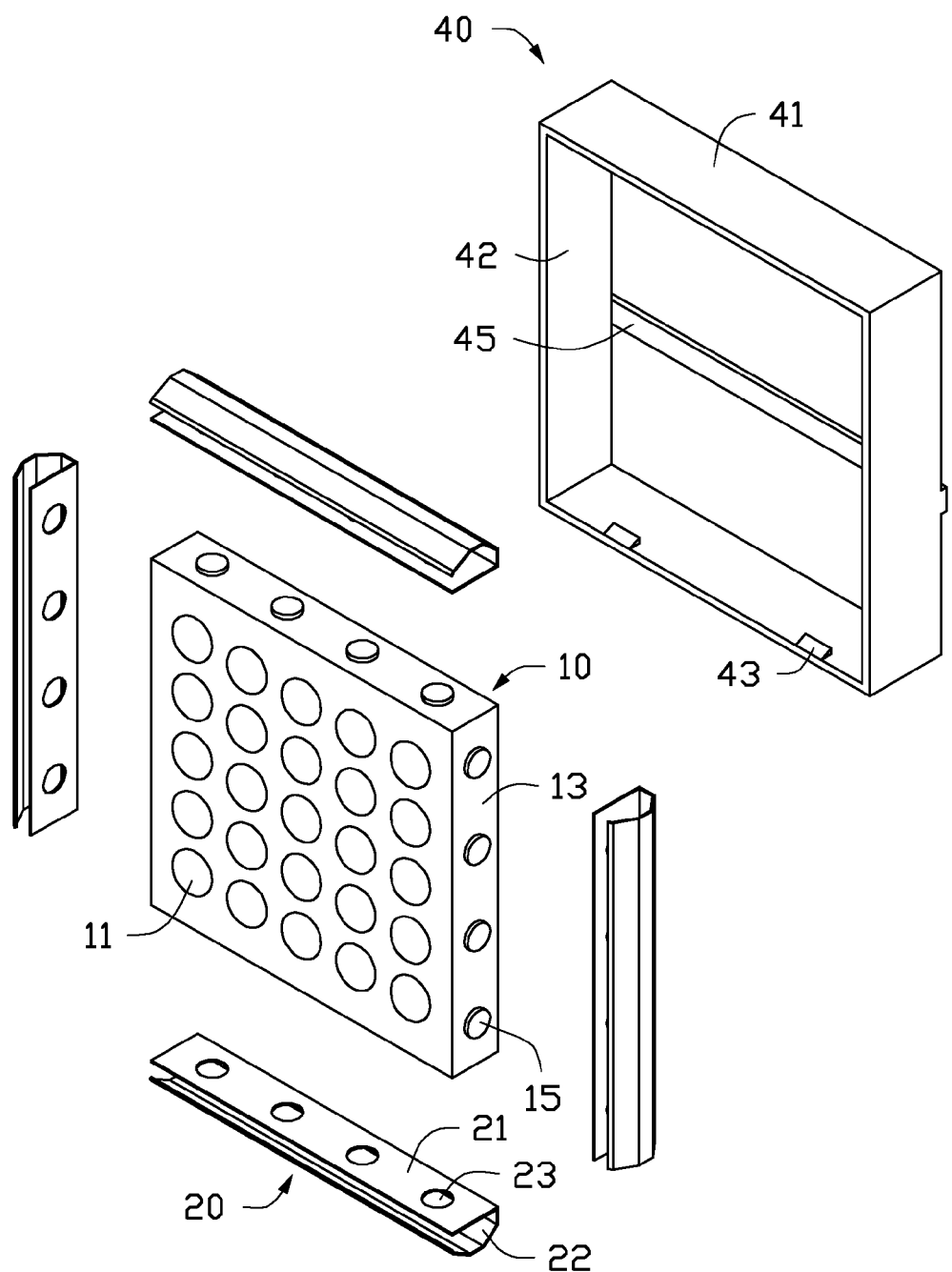
FIG. 1 is an exploded, isometric view of an exemplary embodiment of a fixing apparatus together with a waveguide plate, wherein the fixing apparatus includes four fixing members.

Referring to FIG. 1, an exemplary embodiment of a fixing apparatus for fixing a waveguide plate 10 includes four conductive fixing members 20 and a bracket 40.

The waveguide plate 10 is rectangular. The waveguide plate 10 defines a plurality of through holes 11 extending through opposite side surfaces of the waveguide plate 10. A plurality of protrusions 15 protrudes from each of four sidewalls 13 each perpendicularly connected between corresponding sides of the side surfaces.

The fixing members 20 have the same lengths as the corresponding sidewalls 13. Each fixing member 20 includes an elongated fixing portion 21, and an arc-shaped resilient abutting portion 22 extending from a first side of the fixing portion 21 towards a second side of the fixing portion 21 opposite to the first side. The fixing portion 21 defines a plurality of spaced mounting holes 23, corresponding to the protrusions 15 of the corresponding sidewall 13.

The bracket 40 is a rectangular frame, including two opposite first sidewalls 41 and two opposite second sidewalls 42 perpendicularly connected between corresponding ends of the first sidewalls 41. Two wedged-shaped blocks 43 protrude from the inner surface of each first sidewall 41, adjoining the front side of the bracket 40. The slanting wall of each block 43 is arranged at the front side of the block 43. A bar 45 is connected between middle rear sides of the second sidewalls 42.

Figure 2:
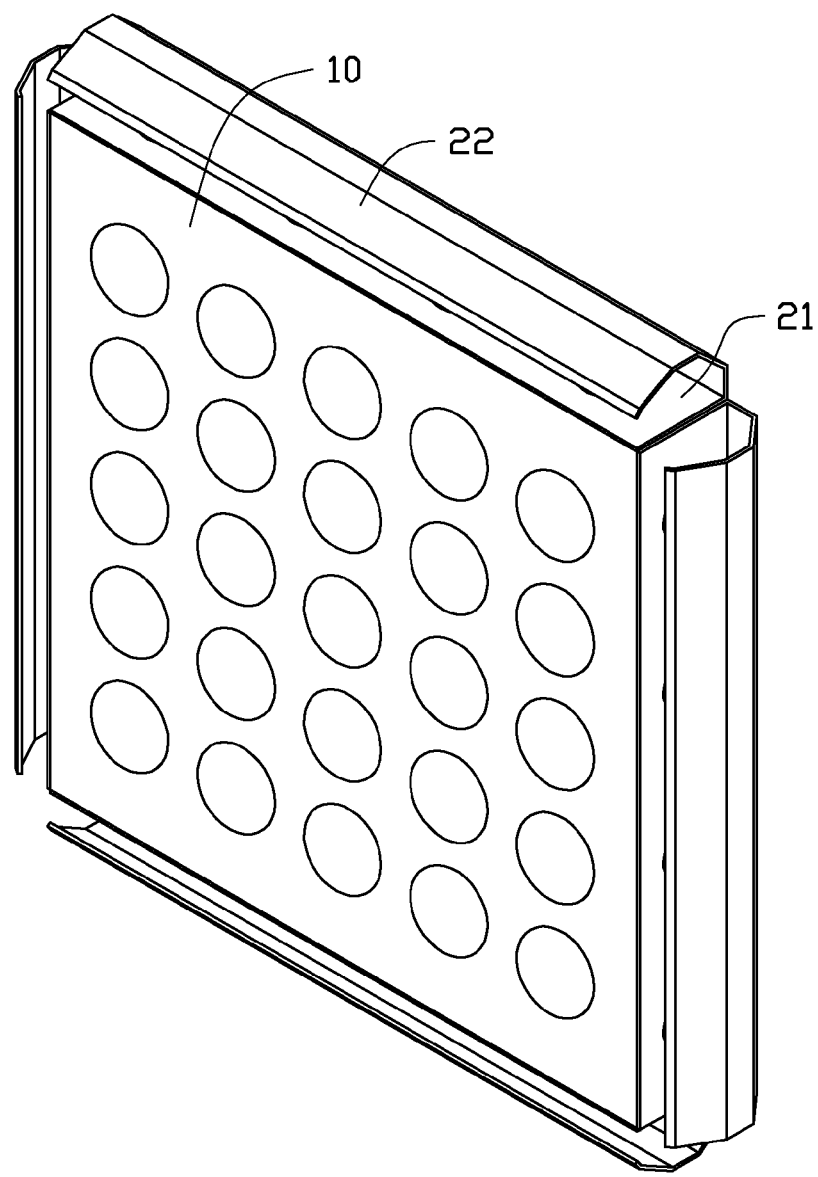
FIG. 2 is an assembled, isometric view of the waveguide plate and the fixing members of FIG. 1.
Figure 3:
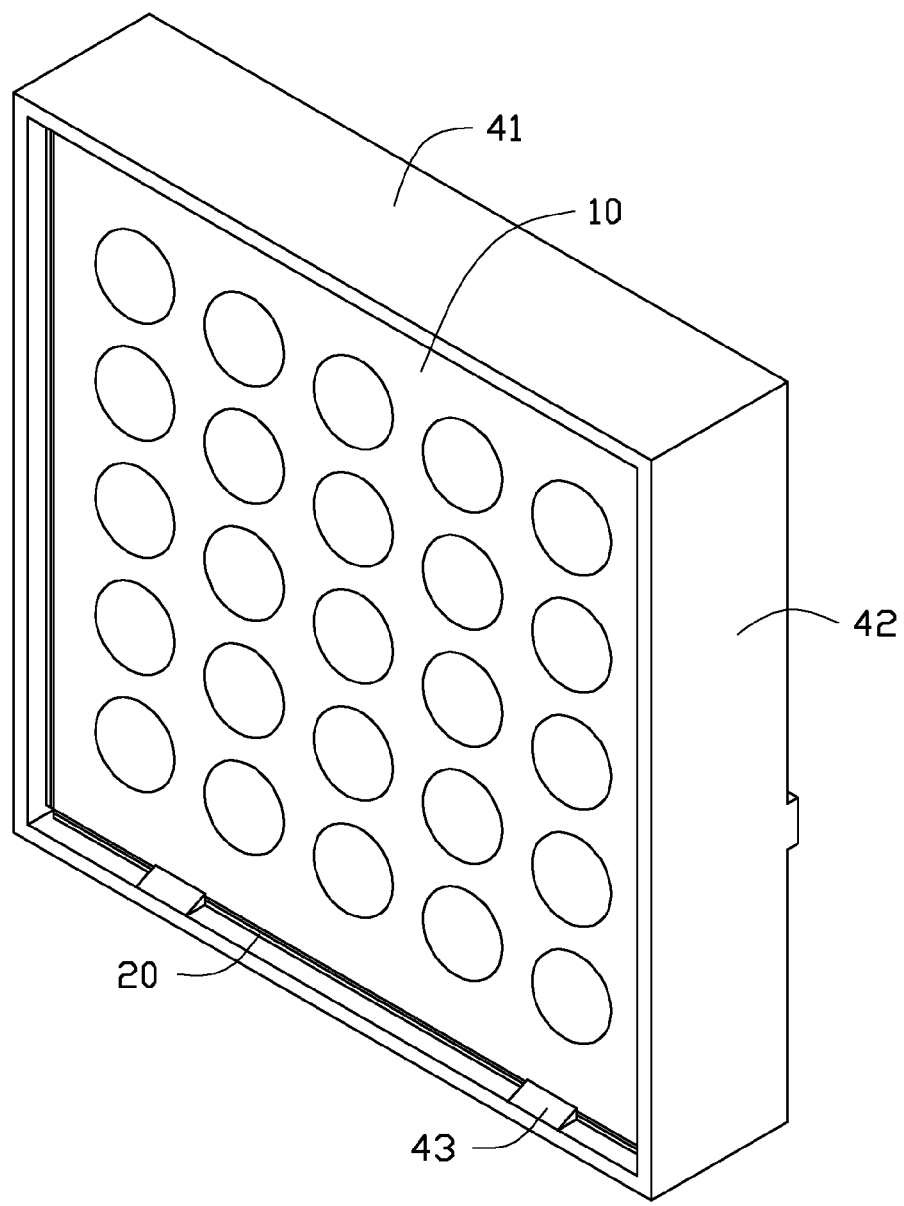
FIG. 3 is an assembled, isometric view of the fixing apparatus and waveguide plate of FIG. 1.

Referring to FIGS. 2 and 3, in assembly, the protrusions 15 are respectively extended through the mounting holes 23, to allow the fixing portions 21 to be in tight contact with the corresponding sidewalls 13. The protrusions 15 are welded to the corresponding fixing portions 21. The waveguide plate 10 together with the fixing members 20 is placed into the bracket 40 from the front side of the bracket 40. The blocks 43 block the front sides of the corresponding fixing members 20. The bar 45 blocks the rear side of the waveguide plate 10. The resilient abutting portions 22 resiliently abut against the inner surfaces of the corresponding first sidewalls 41 and second sidewalls 42.

Because the fixing portions 21 are in tight contact with the corresponding sidewalls 13, and the resilient abutting portions 22 are in tight contact with the inner surface of the corresponding first sidewalls 41 and second sidewalls 42, leaving almost no clearance between the waveguide plate 10 and the bracket 40. The fixing members 20 are conductive, so the fixing members 20 have an effect of electromagnetic wave attenuation. Therefore, the fixing apparatus is good at preventing electromagnetic leakage.

To detach the waveguide plate 10 from the bracket 40, the top and bottom resilient abutting portions 22 are deformed toward the waveguide plate 10. Then the waveguide plate 10 is pushed forward, the waveguide plate 10 together with the fixing members 20 can be taken out of the bracket 40.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A fixing apparatus for a waveguide plate, the fixing apparatus comprising:
    a plurality of conductive fixing members respectively fixed to corresponding sides of the waveguide plate, each fixing member comprising a fixing portion having the same length as the corresponding side to tightly contact the corresponding side of the waveguide plate, and a resilient abutting portion extending from a side of the fixing portion; and
    a bracket comprising a plurality of sidewalls to receive the waveguide plate and the fixing members among the sidewalls, wherein the resilient abutting portions resiliently abut against inner surfaces of the corresponding sidewalls;
    wherein the number of corresponding sides of the waveguide plate is four, and the sidewalls of the bracket comprise two opposite first sidewalls and two opposite second sidewalls connected between corresponding ends of the first sidewalls, a wedged-shaped block protrudes from an inner surface of each first sidewall, adjacent to a front side of the first sidewall and blocking a front side of a corresponding fixing member.

2. The fixing apparatus of claim 1, wherein a bar is connected between rear sides of the second sidewalls, blocking a rear side surface of the waveguide plate.

3. The fixing apparatus of claim 1, wherein each resilient abutting portion is arc-shaped, and extends towards an opposite side of the fixing portion.

4. The fixing apparatus of claim 1, wherein the fixing portions are welded to the corresponding sides of the waveguide plate.

5. A fixing apparatus for a waveguide plate, the fixing apparatus comprising:
- a plurality of conductive fixing members respectively fixed to corresponding sides of the waveguide plate, each fixing member comprising a fixing portion having the same length as the corresponding side to tightly contact the corresponding side of the waveguide plate, and a resilient abutting portion extending from a side of the fixing portion, wherein each resilient abutting portion is arc-shaped, and extends towards an opposite side of the fixing portion; and
- a bracket comprising a plurality of sidewalls to receive the waveguide plate and the fixing members among the sidewalls, wherein the resilient abutting portions resiliently abut against inner surfaces of the corresponding sidewalls.

6. A fixing apparatus for a waveguide plate, the fixing apparatus comprising:
- a plurality of conductive fixing members respectively fixed to corresponding sides of the waveguide plate, each fixing member comprising a fixing portion having the same length as the corresponding side to tightly contact the corresponding side of the waveguide plate, and a resilient abutting portion extending from a side of the fixing portion, wherein the fixing portions are welded to the corresponding sides of the waveguide plate; and
- a bracket comprising a plurality of sidewalls to receive the waveguide plate and the fixing members among the sidewalls, wherein the resilient abutting portions resiliently abut against inner surfaces of the corresponding sidewalls.

* * * * *